United States Patent
Fox et al.

(10) Patent No.: US 7,695,765 B1
(45) Date of Patent: **\*Apr. 13, 2010**

(54) METHODS FOR PRODUCING LOW-STRESS CARBON-DOPED OXIDE FILMS WITH IMPROVED INTEGRATION PROPERTIES

(75) Inventors: Keith Fox, Portland, OR (US); Carole Mars, Portland, OR (US); Willis Kirkpatrick, Yamhill, OR (US); Easwar Srinivasan, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 1365 days.

This patent is subject to a terminal disclaimer.

(21) Appl. No.: 10/987,208

(22) Filed: Nov. 12, 2004

(51) Int. Cl.
  *C23C 16/40* (2006.01)
(52) U.S. Cl. ............... 427/255.37; 427/249.1; 427/579; 427/96.8; 438/787; 438/788; 438/789; 438/790
(58) Field of Classification Search ............ 427/255.37, 427/249.1, 579, 96.8; 438/787, 788, 789, 438/790
See application file for complete search history.

(56) References Cited

U.S. PATENT DOCUMENTS

| | | | |
|---|---|---|---|
| 4,357,451 A | 11/1982 | McDaniel | |
| 4,837,185 A | 6/1989 | Yau et al. | |
| 4,882,008 A | 11/1989 | Garza et al. | |
| 4,885,262 A | 12/1989 | Ting et al. | |
| 5,504,042 A | 4/1996 | Cho et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,849,640 A | 12/1998 | Hsia et al. | |
| 5,851,715 A | 12/1998 | Barthel et al. | |
| 5,858,457 A | 1/1999 | Brinker et al. | |
| 5,920,790 A | 7/1999 | Wetzel et al. | |
| 6,140,252 A | 10/2000 | Cho et al. | |

(Continued)

FOREIGN PATENT DOCUMENTS

WO   WO95/07543   3/1995

(Continued)

OTHER PUBLICATIONS

U.S. Notice of Allowance and Fee Due mailed Sep. 19, 2007, from U.S. Appl. No. 10/800,409.

(Continued)

*Primary Examiner*—Bret Chen
(74) *Attorney, Agent, or Firm*—Weaver Austin Villeneuve & Sampson LLP

(57) ABSTRACT

Methods of preparing a carbon doped oxide (CDO) layer with a low dielectric constant (<3.2) and low residual stress without sacrificing important integration properties such as refractive index and etch rate are provided. The methods involve, for instance, providing a substrate to a deposition chamber and exposing it to TMSA, followed by igniting and maintaining a plasma in a deposition chamber using radio frequency power having high and low frequency components or one frequency component only, and depositing the carbon doped oxide film under conditions in which the resulting dielectric layer has a net tensile stress of less than about 40 MPa, a hardness of at least about 1 GPa, and a SiC:SiO$_x$ bond ratio of not greater than about 0.75.

45 Claims, 8 Drawing Sheets

U.S. PATENT DOCUMENTS

| | | | |
|---|---|---|---|
| 6,149,828 A | 11/2000 | Vaartstra | |
| 6,171,661 B1 | 1/2001 | Zheng et al. | |
| 6,177,329 B1 | 1/2001 | Pang | |
| 6,232,658 B1 | 5/2001 | Catabay et al. | |
| 6,258,735 B1 | 7/2001 | Xia et al. | |
| 6,268,276 B1 | 7/2001 | Chan et al. | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,306,564 B1 | 10/2001 | Mullee | |
| 6,312,793 B1 | 11/2001 | Grill et al. | |
| 6,329,017 B1 | 12/2001 | Liu et al. | |
| 6,329,062 B1 | 12/2001 | Gaynor | |
| 6,331,480 B1 | 12/2001 | Tsai et al. | |
| 6,340,628 B1 | 1/2002 | Van Cleemput et al. | |
| 6,365,266 B1 | 4/2002 | MacDougall et al. | |
| 6,365,528 B1 | 4/2002 | Sukharev et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,407,013 B1 | 6/2002 | Li et al. | |
| 6,410,462 B1 | 6/2002 | Yang et al. | |
| 6,413,583 B1 | 7/2002 | Moghadam et al. | |
| 6,420,441 B1 | 7/2002 | Allen et al. | |
| 6,436,824 B1 | 8/2002 | Chooi et al. | |
| 6,444,715 B1 | 9/2002 | Mukherjee et al. | |
| 6,455,417 B1 | 9/2002 | Bao et al. | |
| 6,465,366 B1 | 10/2002 | Nemani et al. | |
| 6,479,374 B1 | 11/2002 | Ioka et al. | |
| 6,479,409 B2 | 11/2002 | Shioya et al. | |
| 6,500,770 B1 | 12/2002 | Cheng et al. | |
| 6,548,113 B1 | 4/2003 | Birnbaum et al. | |
| 6,558,755 B2 | 5/2003 | Berry et al. | |
| 6,566,278 B1 | 5/2003 | Harvey et al. | |
| 6,570,256 B2 | 5/2003 | Conti et al. | |
| 6,572,925 B2 | 6/2003 | Zubkov et al. | |
| 6,573,030 B1 | 6/2003 | Fairbairn et al. | |
| 6,576,300 B1 | 6/2003 | Berry et al. | |
| 6,576,345 B1 | 6/2003 | Cleemput et al. | |
| 6,596,467 B2 | 7/2003 | Gallagher et al. | |
| 6,596,654 B1 | 7/2003 | Bayman et al. | |
| 6,610,362 B1 | 8/2003 | Towle | |
| 6,632,478 B2 | 10/2003 | Gaillard et al. | |
| 6,662,631 B2 | 12/2003 | Baklanov et al. | |
| 6,667,147 B2 | 12/2003 | Gallagher et al. | |
| 6,677,251 B1 | 1/2004 | Lu et al. | |
| 6,680,262 B2 | 1/2004 | Wu | |
| 6,713,407 B1 | 3/2004 | Cheng et al. | |
| 6,715,498 B1 | 4/2004 | Humayun et al. | |
| 6,740,602 B1 | 5/2004 | Hendriks et al. | |
| 6,756,085 B2 | 6/2004 | Waldfried et al. | |
| 6,759,098 B2 | 7/2004 | Han et al. | |
| 6,797,643 B2 * | 9/2004 | Rocha-Alvarez et al. | 438/758 |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 | 3/2005 | Chen et al. | |
| 6,890,850 B2 | 5/2005 | Lee et al. | |
| 6,903,004 B1 | 6/2005 | Spencer et al. | |
| 6,914,014 B2 * | 7/2005 | Li et al. | 438/781 |
| 6,921,727 B2 | 7/2005 | Chiang et al. | |
| 6,943,121 B2 | 9/2005 | Leu et al. | |
| 7,018,918 B2 | 3/2006 | Kloster et al. | |
| 7,064,088 B2 * | 6/2006 | Hyodo et al. | 438/787 |
| 7,087,271 B2 * | 8/2006 | Rhee et al. | 427/577 |
| 7,094,713 B1 | 8/2006 | Niu et al. | |
| 7,098,149 B2 | 8/2006 | Lukas et al. | |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,241,704 B1 | 7/2007 | Wu et al. | |
| 7,288,292 B2 | 10/2007 | Gates et al. | |
| 7,326,444 B1 * | 2/2008 | Wu et al. | 427/579 |
| 7,341,761 B1 * | 3/2008 | Wu et al. | 427/255.37 |
| 7,381,659 B2 | 6/2008 | Nguyen et al. | |
| 7,381,662 B1 | 6/2008 | Niu et al. | |
| 7,390,537 B1 * | 6/2008 | Wu et al. | 427/577 |
| 7,473,653 B1 | 1/2009 | Wu et al. | |
| 2002/0001973 A1 | 1/2002 | Wu et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0123240 A1 | 9/2002 | Gallagher et al. | |
| 2002/0132496 A1 | 9/2002 | Ball et al. | |
| 2002/0141024 A1 | 10/2002 | Retschke et al. | |
| 2002/0172766 A1 | 11/2002 | Laxman et al. | |
| 2002/0192980 A1 | 12/2002 | Hogle et al. | |
| 2003/0064607 A1 | 4/2003 | Leu et al. | |
| 2003/0066544 A1 | 4/2003 | Jur et al. | |
| 2003/0111263 A1 | 6/2003 | Fornof et al. | |
| 2003/0119307 A1 | 6/2003 | Bekiaris et al. | |
| 2003/0157248 A1 | 8/2003 | Watkins et al. | |
| 2003/0198895 A1 | 10/2003 | Toma et al. | |
| 2003/0203652 A1 * | 10/2003 | Bao et al. | 438/783 |
| 2003/0224156 A1 | 12/2003 | Kirner et al. | |
| 2004/0018717 A1 | 1/2004 | Fornof et al. | |
| 2004/0069410 A1 | 4/2004 | Moghadam et al. | |
| 2004/0096586 A1 | 5/2004 | Schulberg et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0102032 A1 | 5/2004 | Kloster et al. | |
| 2004/0161532 A1 | 8/2004 | Kloster et al. | |
| 2004/0166240 A1 | 8/2004 | Rhee et al. | |
| 2004/0170760 A1 | 9/2004 | Meagley et al. | |
| 2004/0185679 A1 | 9/2004 | Ott et al. | |
| 2004/0213911 A1 | 10/2004 | Misawa et al. | |
| 2004/0249006 A1 | 12/2004 | Gleason et al. | |
| 2005/0025892 A1 | 2/2005 | Satoh et al. | |
| 2005/0064698 A1 | 3/2005 | Chang et al. | |
| 2005/0095840 A1 | 5/2005 | Bhanap et al. | |
| 2005/0156285 A1 | 7/2005 | Gates et al. | |
| 2005/0230834 A1 | 10/2005 | Schmitt et al. | |
| 2005/0260357 A1 | 11/2005 | Zheng et al. | |
| 2006/0024976 A1 | 2/2006 | Waldfried et al. | |
| 2006/0027929 A1 | 2/2006 | Cooney et al. | |
| 2006/0040507 A1 | 2/2006 | Mak et al. | |
| 2006/0105566 A1 | 5/2006 | Waldfried et al. | |
| 2006/0110931 A1 | 5/2006 | Fukazawa et al. | |
| 2006/0145304 A1 | 7/2006 | Boyanov et al. | |
| 2006/0145305 A1 | 7/2006 | Boyanov et al. | |
| 2006/0178006 A1 | 8/2006 | Xu et al. | |
| 2006/0197881 A1 | 9/2006 | Kang et al. | |
| 2008/0009141 A1 | 1/2008 | Dubois et al. | |
| 2008/0132055 A1 | 6/2008 | Nguyen et al. | |
| 2008/0194105 A1 | 8/2008 | Dominquez et al. | |

FOREIGN PATENT DOCUMENTS

| | | | |
|---|---|---|---|
| WO | WO 02/21593 A2 | 3/2002 | |
| WO | WO 03/005426 A1 * | 1/2003 | |
| WO | WO 03/005429 * | 1/2003 | |
| WO | WO 03/005429 A1 | 1/2003 | |

WO  WO 03/052794 A2  6/2003

OTHER PUBLICATIONS

Allowed Claims from U.S. Appl. No. 10/800,409.
U.S. Office Action dated Nov. 28, 2007, from U.S. Appl. No. 10/807,680.
R.J. Lewis, Sr., Hawley's Condensed Chemical Dictionary, 12th Edition, Van Nostrand Reinhold Co., New York, 1993 (no month), excerpts pp. 916-918 & 1123-1124.
U.S. Office Action mailed Oct. 4, 2007, from U.S. Appl. No. 10/820,525.
Wu et al., "Methods For Producing Low Stress Porous Low-K Dielectric Materials Using Precursors With Organic Functional Groups", U.S. Appl. No. 11/764,750, filed Jun. 18, 2007.
U.S. Office Action mailed Oct. 29, 2007, from U.S. Appl. No. 11/764,750.
Wu et al., Methods For Producing Low-K CDO Films, U.S. Appl. No. 11/936,754, filed Nov. 7, 2007.
Wu et al., "Methods For Improving Integration Performance of Low Stress CDO Films", U.S. Appl. No. 11/936,752, filed Nov. 7, 2007.
U.S. Notice of Allowance and Fee Due mailed Sep. 27, 2007, from U.S. Appl. No. 11/376,510.
Allowed Claims from U.S. Appl. No. 11/376,510.
Wu et al., "Methods For Improving Integration Performance Of Low Stress CDO Films", U.S. Appl. No. 10/941,502, filed Sep. 14, 2004.
U.S. Office Action mailed Nov. 30, 2006, from U.S. Appl. No. 10/927,777.
U.S. Office Action mailed Mar. 28, 2007, from U.S. Appl. No. 10/820,525.
U.S. Office Action mailed Jan. 24, 2007, from U.S. Appl. No. 10/789,103.
U.S. Office Action mailed Jun. 21, 2007, from U.S. Appl. No. 10/789,103.
U.S. Notice of Allowance and Fee Due mailed Dec. 19, 2006, from U.S. Appl. No. 10/800,409.
U.S. Office Action mailed Apr. 9, 2007, from U.S. Appl. No. 10/800,409.
Niu et al., "Methods for Improving the Cracking Resistance of Low-K Dielectric Materials," Novellus Systems, Inc., U.S. Appl. No. 11/376,510, filed Mar. 14, 2006, pp. 1-28.
U.S. Office Action dated May 22, 2007, from U.S. Appl. No. 11/376,510.
U.S. Notice of Allowance and Fee Due mailed Apr. 9, 2007, from U.S. Appl. No. 10/927,777.
Allowed Claims from U.S. Appl. No. 10/927,777.
U.S. Final Office Action mailed Apr. 3, 2007, from U.S. Appl. No. 10/941,502.
U.S. Notice of Allowance and Fee Due mailed Dec. 20, 2005, from U.S. Appl. No. 10/860,340.
Wu et al., "PECVD Methods for Producing Ultra Low-K Dielectric Films Using UV Treatment," Novellus Systems, Inc., U.S. Appl. No. 11/608,056, filed Dec. 7, 2006, pp. 1-34.
Wu et al., "Methods for Improving Performance of ODC Films with Dielectric Constant < 4.0," Novellus Systems, Inc., U.S. Appl. No. 11/693,661, filed Mar. 29, 2007, pp. 1-46.
U.S. Office Action mailed Sep. 8, 2006, from U.S. Appl. No. 10/404,693.
U.S. Office Action mailed Sep. 7, 2006, from U.S. Appl. No. 10/820,525.
U. S. Office Action mailed Jul. 12, 2006, from U.S. Appl. No. 10/672,305.
Wu et al., "Methods for Fabricating High Hardness/Modules Low Dielectric Constant Materials," Novellus Systems, Inc., U.S. Appl. No. 11/369,658, filed Mar. 6, 2006, pp. 1-33.
Dhas et al., "Method of Reducing Defects in PECVD TEOS Films," Novellus Systems, Inc., U.S. Appl. No. 11/396,303, filed Mar. 30, 2006, pp. 1-21.
U.S. Office Action mailed May 31, 2006, from U.S. Appl. No. 10/941,502.
U.S. Office Action mailed May 30, 2006, from U.S. Appl. No. 10/785,235.
U.S. Office Action mailed May 31, 2006, from U.S. Appl. No. 10/849,568.
U.S. Office Action mailed May 2, 2006, from U.S. Appl. No. 11/050,621.
U.S. Office Action mailed Jun. 15, 2006, from U.S. Appl. No. 10/800,409.
Kelman et al., "Method for Reducing Stress in Porous Dielectric Films", U.S. Appl. No. 11/369,311, filed Mar. 6, 2006.
U.S. Office Action mailed Jun. 28, 2006, from U.S. Appl. No. 10/825,888.
U.S. Office Action mailed May 2, 2006, from U.S. Appl. No. 10/295,965.
U.S. Office Action mailed Aug. 9, 2005, from U.S. Appl. No. 10/295,965.
U.S. Office Action mailed Jun. 14, 2006, from U.S. Appl. No. 10/789,103.
Subramonium et al., "Pulsed PECVD Method for Modulating Hydrogen Content in Hard Mask", U.S. Appl. No. 11/318,269, filed Dec. 23, 2005.
U.S. Office Action mailed Feb. 28, 2006, from U.S. Appl. No. 10/404,693.
U.S. Office Action mailed Mar. 29, 2006, from U.S. Appl. No. 10/800,377.
U.S. Office Action mailed Dec. 27, 2005, from U.S. Appl. No. 10/789,103.
U.S. Office Action mailed Dec. 23, 2005, from U.S. Appl. No. 10/800,409.
U.S. Office Action mailed Feb. 7, 2006, from U.S. Appl. No. 10/672,305.
U.S. Office Action mailed Dec. 20, 2005, from U.S. Appl. No. 10/672,311.
U.S. Office Action mailed Dec. 20, 2005, from U.S. Appl. No. 10/849,568.
U.S. Office Action mailed Jan. 9, 2006, from U.S. Appl. No. 10/785,235.
Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.
U.S. Office Action mailed Aug. 24, 2005, from U.S. Appl. No. 10/404,693.
U.S. Office Action mailed Sep. 1, 2005, from U.S. Appl. No. 10/672,305.
U.S. Office Action mailed Jul. 13, 2005, from U.S. Appl. No. 10/672,311.
U.S. Office Action mailed Jul. 27, 2005, from U.S. Appl. No. 10/785,235.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.
Humayun et al., "Method for Forming Porous Films By Porogen Removel Combined Wtih In Situ Surface Modification", Novellus Corporation, U.S. Appl. No. 10/404,693, filed Mar. 31, 2003, pp. 1-32.
Tipton et al., "Method Of Porogen Removal From Porous Low-K Films Using UV Radiation", Novellus Systems, Inc., U.S. Appl. No. 10/672,311, filed Sep. 26, 2003, pp. 1-27.
Jan, C.H., et al, *90NM Generation, 300mm Wafer Low k ILD/Cu Interconnect Technology*, 2003 IEEE Interconnect Technology Conference.
U.S. Appl. No. 10/016,017, filed Dec. 12, 2001.
U.S. Appl. No. 10/125,614, filed Apr. 18, 2002.
U.S. Appl. No. 10/202,987, filed Jul. 23, 2002.

Tipton et al., "Methods for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured AI," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Appl. No. 10/789,103, entitled: "Methods for Producing Low-K CDO Films with Low Residual Stress", by Wu et al., filed Feb. 17, 2004.

U.S. Appl. No. 10/820,525, entitled: "Methods for Producing Low-K CDEO Films with Low Residual Stress", by Wu et al., filed Apr. 7, 2004.

U.S. Appl. No. 10/941,502, entitled: "Methods for Improving Integration Performance of Low-Stress CDO Films", by Wu, filed Sep. 14, 2004.

U.S. Appl. No. 09/996,619, entitled: "Gap Fill for High Aspect Ratio Structures", by Bayman et al., filed Nov. 28, 2001.

U.S. Appl. No. 10/800,409, entitled: "Methods for Producing Low-K CDO Films", by Wu et al., filed Mar. 11, 2004.

U.S. Office Action dated Mar. 2, 2005, from U.S. Appl. No. 10/860,340.

U.S Final Office Action mailed Jun. 13, 2005, from U.S. Appl. No. 10/860,340.

U.S. Notice of Allowance and Fee Due mailed Sep. 20, 2007, from U.S. Appl. No. 10/941,502.

Allowed Claims from U.S. Appl. No. 10/941,502.

U.S. Notice of Allowance and Fee Due mailed Feb. 11, 2008, from U.S. Appl. No. 10/789,103.

Allowed Claims from U.S. Appl. No. 10/789,103.

U.S. Office Action mailed Mar. 31, 2008, from U.S. Appl. No. 10/820,525.

U.S. Office Action dated Jul. 10, 2008, from U.S. Appl. No. 10/807,680.

U.S. Final Office Action mailed May 29, 2008, from U.S. Appl. No. 11/764,750.

U.S. Notice of Allowance and Fee Due mailed Aug. 25, 2008, from U.S. Appl. No. 11/764,750.

Allowed Claims from U.S. Appl. No. 11/764,750.

Solomons and Fryhle, Organic Chemistry, 9$^{th}$ Edition, John Wiley & Sons, Inc., 2008, pp. 602-603.

Wu et al., Methods for Fabricating High Hardness/Modulus Low Dielectric Constant Materials, Novellus Systems, Inc., U.S. Appl. No. 11/369,658, filed Mar. 6, 2006.

U.S. Office Action dated Dec. 12, 2008, from U.S. Appl. No. 11/369,658.

U.S. Final Office Action dated Dec. 4, 2008, from U.S. Appl. No. 10/820,525.

Szekeres, A. et al., "Plasma-assisted chemical vapor deposited silicon oxynitride as an alternative material for gate dielectric in MOS devices." Microelectronics Journal 37 (2006) pp. 64-70.

U.S. Office Action for U.S. Appl. No. 11/606,340 mailed Feb. 5, 2009.

U.S. Office Action for U.S. Appl. No. 11/936,754 mailed Jun. 19, 2009.

U.S. Office Action for U.S. Appl. No. 11/369,658 mailed Jul. 8, 2009.

Wu et al., PECVD Methods For Producing Ultra Low-K Dielectric Films Using UV Treatment, Novellus Systems, Inc., U.S. Appl. No. 11/608,056, filed Dec. 7, 2006.

U.S. Office Action for U.S. Appl. No. 11/608,056 mailed Aug. 20, 2009.

Wu et al., Methods For Improving Performance of ODC Films With Dielectric Constant < 4.0, Novellus Systems, Inc., U.S. Appl. No. 11/693,661, filed Mar. 29, 2007.

U.S. Office Action for U.S. Appl. No. 10/820,525 mailed Aug. 7, 2009.

U.S. Office Action for U.S. Appl. No. 11/693,661 mailed Aug. 28, 2009.

* cited by examiner

METHODS FOR PRODUCING LOW-STRESS CARBON-DOPED OXIDE FILMS WITH IMPROVED INTEGRATION PROPERTIES

CROSS-REFERENCE TO RELATED PATENT APPLICATIONS

This application is related to U.S. patent application Ser. No. 10/789,103, filed on Feb. 17, 2004, by Wu et al., and titled "Methods for Producing Low-K CDO Films with Low Residual Stress," which claims priority from U.S. Provisional Patent Application No. 60/524,330, filed on Nov. 20, 2003, by Wu et al., and titled "Methods for Producing Low-K CDO Film of Low Residual Stress With Dielectric Constant <3.0," U.S. patent application Ser. No. 10/820,525, filed on Apr. 7, 2004, and titled "Methods for Producing Low-K CDO Films with Low Residual Stress", U.S. patent application Ser. No. 10/941,502, filed on Sep. 14, 2004, and titled "Methods for Improving Integration Performance of Low-Stress CDO Films", and U.S. patent application Ser. No. 10/800,409, filed on Mar. 11, 2004, and titled "Methods for Producing Low-K CDO Films," all of which are incorporated herein by reference for all purposes.

FIELD OF THE INVENTION

This invention relates to methods for preparing dielectric films having low dielectric constants, high mechanical strength, and improved integration properties. More specifically, the invention relates to process optimization and improvement through precursor selection, carrier gas selection, and process parameter optimization, to improve the integration properties of low-stress carbon-doped oxide (CDO) films.

BACKGROUND

There is a general need for materials with low dielectric constants (low-k) in the integrated circuit manufacturing industry. Using low-k materials as the interlayer dielectric of conductive interconnects reduces the delay in signal propagation and signal crosstalk due to capacitive effects. Further, the use of low k materials as interlayer dielectrics reduces power consumption of complex integrated circuits.

Low-k dielectrics are conventionally defined as those materials that have a dielectric constant (k) lower than that of silicon dioxide ($SiO_2$), that is k<~4. Generally, they have a dielectric constant of 3.2 or less. Typical methods of obtaining low-k materials include introducing pores into the dielectric matrix and/or doping silicon dioxide with various hydrocarbons or fluorine. In technology nodes of 90 nanometers and beyond, carbon doped oxide dielectric materials look extremely promising. However, wide spread deployment of these materials in modern integrated circuit fabrication processes presents some technological hurdles.

Specifically, in comparison with silicon dioxide, low k CDO materials typically have inferior mechanical properties due to the incorporation of ending methyl groups (—CH3) in order to lower the k value of CDO materials. These mechanical properties include hardness, modulus, film residual stress, blanket film cracking threshold or limit, fracture toughness, etc. These properties are derived primarily from the strength of the atomic bonds and their binding energy. For instance, when using conventional Si containing organics as precursors in a conventional plasma enhanced chemical vapor deposition (PECVD) process, the resulting dielectric CDO film will usually possess a dielectric constant of 2.7-2.95 with a hardness of 1.2-2.0 GPa, modulus of 6.6 to 12 GPa, and a blanket film cracking limit between 2.3-2.7 μm. It is noted that the cracking limit is an overall measure of mechanical properties of a CDO film. Many applications will require cracking thresholds of greater than 3 μm, and more preferably greater than 5 μm. CDO materials of inferior mechanical properties will have adhesive (delamination) and cohesive (cracking) failures during the Cu-low k integration and packaging steps. These failures are exacerbated by the increasing complexity of integrated circuits and manifest as growing numbers of metallization layers. It is not uncommon for a modern IC design to require nine metallization layers, each with a separate dielectric layer. Each of these dielectric layers will have to withstand mechanical stresses from, for example, Chemical Mechanical Polishing (CMP) and/or thermal and mechanical stresses incurred during IC packaging operations.

In addition to modulus, a mechanical property of growing importance is the residual (or internal) stress in a dielectric film. As explained below, residual stress is comprised of an extrinsic stress component and an intrinsic stress component. Further, residual stress can be either compressive or tensile. Conventional low k films (k<3.2), including CDO films, typically have a tensile stress in excess of 50 MPa. The residual stresses within a deposited dielectric film are of particular interest for this invention. In IC fabrication contexts, these stresses can manifest in different ways, including cracking initiation and propagation and bowing or arching of die, which indicate net tensile or compressive stress. Low residual stress leads to a low cracking driving force, a high cracking or buckling limit and hence a low failure rate during Cu-low k integration and packaging.

Many device failures can ultimately be traced to stresses and their variations at various stages of IC processing. Those failures include interfacial delamination between different materials and cracking within one material during chemical mechanical polishing (CMP) and packaging. Excessive stress of thin films, such as CDO films, will also accumulate through multiple layer integration and will result in wafer warping and CMP issues. Since device feature size is continuously shrinking, stress related problems are expected to become more severe.

Thus, there is a need for low-stress dielectric films. However, methods that create lower stress CDO films often produce films with significantly different chemical properties than the CDO films in use in many current applications. Generally, the suitability of a low dielectric constant film can be determined by the ease with which it can be integrated into an interconnect stack. Ideally, it is desirable that low-stress films have comparable etch rates when compared with existing low-k material layers. Some current methods of creating low-stress CDO films result in low-k films with refractive indices/etch rates which are very similar to oxygen doped carbide materials which are often used as barrier layers, resulting in comparable etch rates for barrier layers and low-k material layers-potentially complicating integration and creating a need for new integration schemes. Thus, there is a high demand for methods that will produce low-stress, low-k CDO films with refractive indices/etch rates similar to existing conventional low-k films.

To achieve the foregoing, methods of improving the mechanical properties of thin films, including CDO films, are disclosed. Further, this invention relates to techniques for creating low-stress, low-k carbon-doped oxide (CDO) layers by modifying the CDO film's structure using chemical bond reconstruction to alter SiC/SiO ratios such that the refractive index/etch rate of the CDO material is similar to that of existing conventional low-k films. In particular, this invention presents methods to modify the film structure of a low-stress CDO film without an appreciable loss in film performance, thus allowing easier integration of low-stress CDO films into an interconnect stack.

In one embodiment of the invention, a carbon doped silicon oxide (CDO) film is deposited on a substrate by contacting the substrate with one or more CDO precursors having a high carbon content to form a CDO film with a SiC:SiO$_x$ bond ratio of not greater than about 0.75, a net tensile stress of less than about 40 MPa, a hardness of at least about 1 GPa, and a dielectric constant of less than about 3.2.

In some embodiments, the CDO film is formed on the substrate by a chemical deposition process (for example PECVD), using one or more precursors carried in a carrier gas such as $CO_2$, Ar, or He. In a specific implementation, the CDO precursor is Ethynyltrimethylsilane (ETMS), also known as trimethylsilaneacetylene (TMSA).

In other embodiments, a secondary precursor is added. In one implementation diethoxymethylsilane (DEMS) and/or tetramethylcyclotetrasiloxane (TMCTS) are added. Further, in one or more of these embodiments, another reactant, hexafluoroethane ($C_2F_6$), is introduced into the deposition chamber.

Flow rates of the various precursors, carrier gases, and reactants vary broadly. A typical flow rate for TMSA is the range of between about 0.3 mL/min to 10 mL/min, preferably in the range of between about 2.5 mL/min to 3.5 mL/min. If DEMS is added, the flow rates range broadly from between about 0.3 mL/min to 5 mL/min for each and more preferably in the range of between about 1.5 mL/min to 2.5 mL/min for each. If TMCTS is added, the flow rates range broadly from 1 mL/min to 3 mL/min and more preferably in the range of 1 mL/min to 2 mL/min. The flow rate of $O_2$ ranges broadly between about 100 mL/min to 1000 mL/min, more preferably in the range of 100 mL/min to 400 mL/min. The flow rate for hexafluoroethane varies between about 0 mL/min to 1000 mL/min, preferably between about 0 mL/min to 500 mL/min.

The flow rates of the various carrier gases range broadly as well. For $CO_2$, the broad range is between about 1000 sccm to 15000 sccm, while the preferred range is between about 1500 sccm to 8000 sccm. In some embodiments, Ar and He are substituted for $CO_2$. When Ar and/or He are added, flow rates range broadly from between about 1000 sccm to 10000 sccm for each and, more preferably, between about 1500 sccm to 2500 sccm for He and 1500 sccm to 3500 sccm for Ar. In embodiments where Ar and/or He are added, He and Ar flow rates may be the same or different.

In another embodiment of the invention, an integrated circuit (IC) with one or more CDO dielectric layers having carbon-carbon triple bonds or both and/or their derivative forms generated during the deposition is provided. In some embodiments, the CDO layer serves as an interlayer dielectric in the IC. In a preferred embodiment, the CDO dielectric layer has a dielectric constant of less than about 3.2, a net tensile stress of less than about 40 MPa, a hardness of at least about 1 GPa, and a SiC:SiO$_x$ bond ratio of not greater than about 0.75.

In still another embodiment, deposited CDO films have a SiC:SiO$_x$ bond ratio of between about 0.2 to 0.7, a SiH/SiO$_x$ bond ratio of between about 0.01 to 0.18, and a refractive index (RI) of 1.4-1.65 measured at 633 nm.

These and other features and advantages of the invention will be presented in more detail below with reference to the associated drawings.

INTRODUCTION AND OVERVIEW

Figure 1A:
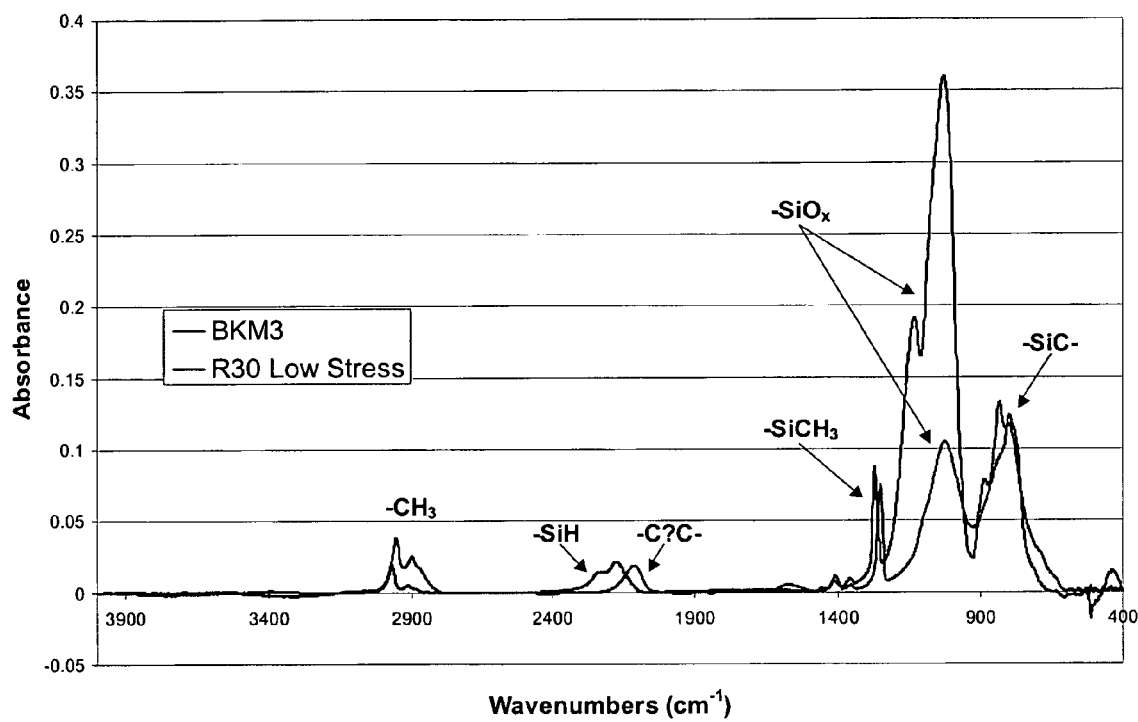
FIG. 1A is a graphical comparison of the FTIR spectra of a baseline TMSA CDO film and a conventional CDO film.

The present invention relates to methods of creating low-stress, low-k carbon-doped oxide (CDO) layers by modifying the CDO film's structure using chemical bond reconstruction to alter Si—C:Si—O ratios such that the refractive index/etch rate of the CDO material is similar to that of existing conventional low-k films. In particular, this invention presents methods to modify the film structure of a low-stress CDO film without appreciable changes in the film's refractive index and/or etch resistance, thus allowing easier integration of low-stress CDO films into an interconnect stack. One approach involves the introduction of oxygen to the process chemistry to impart the desired bonding. A second approach involves, in addition to adding oxygen, using argon and nitrogen as carrier gases.

Generally, CDO film refers to a material whose compositional elements include Si, O, C and H. It may contain traces of other elements, including fluorine (F) or germanium (Ge). "Low-k", in the context of this invention, means that the dielectric constant of the CDO layer is not greater than about 3.5 and preferably not greater than about 3.2.

The residual stress in a thin film can arise from two different sources: intrinsic and extrinsic. Extrinsic stress is produced from a source external to the film. In integrated circuits, extrinsic stress is typically caused by the mismatch in thermomechanical properties between a dielectric layer and the underlying substrate, especially a mismatch in their thermal expansion coefficients. Lowering deposition temperature will minimize the extrinsic stress in a film, as will a smaller mismatch in coefficients of thermal expansion between the film and the substrate.

Intrinsic stress can be traced to the film-growth mechanism and the final lattice structure of the dielectric material. It depends upon the deposition conditions, such as for example, during a plasma enhanced chemical vapor deposition (PECVD), the deposition temperature, the frequency and power of a radio frequency (RF) source used to generate a plasma, deposition pressure, deposition rate, and chemical precursor(s) used.

From a materials standpoint, it is believed that intrinsic stress in CDO films is determined by the backbone structure, that is the Si—O—Si matrix. CDO films produced by conventional processes possess many terminal groups such as free methyl and ethyl groups attached to the Si—O—Si matrix. The resulting Si—O—Si matrix has a structure, defined by its average bonding length and angle, that are less than ideal to match with the substrate material to yield low residual stress. It is noted by this invention that the intrinsic stress of a CDO film can be reduced by optimizing the Si—O—Si matrix structure through introducing additional bonds of different length, bonds of different angles, and cross-linking between bonds. And, in fact, it has been found that intrinsic stress can be reduced by incorporating carbon-carbon triple bonds and bonds of their derivatives in the form of crosslinking in the CDO film. Further it has been found that the incorporation of these bonds and their crosslinking optimizes the Si—O—Si matrix structure and reduces the tensile stress of CDO film.

The residual stress of a conventional CDO film produced under unoptimized process conditions is generally >50 MPa with a typical value in the range between 60 MPa and 90 MPa. In comparison, a baseline low-stress CDO film produced according to an embodiment disclosed in Wu et al. (U.S. patent application Ser. No. 10/789,103, referenced above) using trimethylsilaneacetylene (TMSA), also known as Ethynyltrimethylsilane (ETMS), $(CH_3)_3Si—C≡C—H$ ($SiC_5H_{10}$), and using $CO_2$ as a carrier gas has much lower stress than a conventional CDO film, typically in the range of about 4 MPa. However, this TMSA/$CO_2$ film is structurally different from a conventionally produced CDO film. FIG. 1A is a comparison of the FTIR spectra of the baseline TMSA CDO film and a conventional CDO film, in this case the Novellus HMS CORAL™ low-k dielectric film. Note the difference in the SiC peak (~800 $cm^{-1}$) and the $SiO_x$ peak (~1030 $cm^{-1}$) between the two films. There is also a new peak at ~2110 $cm^{-1}$ corresponding to the C≡C introduced with the TMSA. FIG. 1A indicates that the conventional CDO film has much less —$CH_3$ incorporated than the low-stress baseline film. Further, the baseline TMSA film has a SiC:$SiO_x$ bond ratio of about 1.05, indicating that there is less $SiO_x$ than SiC in the film. In contrast, the conventional CDO film has a significantly lower SiC:SiO bond ratio (about 0.25).

Figure 1B:
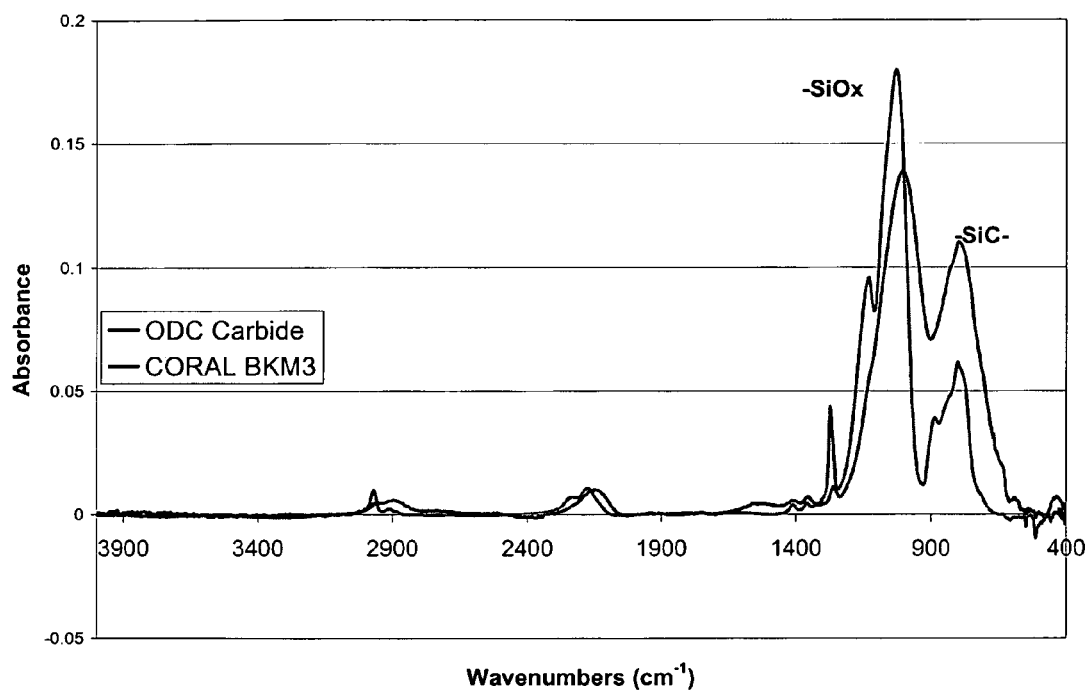
FIG. 1B superimposes the FTIR spectra of a baseline TMSA CDO film and a typical ODC film.

As mentioned above, the TMSA baseline film's high SiC:SiOx ratio (relative to that of the conventional CDO film), causes the film to have a refractive index/etch rate which more closely resembles oxygen-doped carbide (ODC) films than CDO films. FIG. 1B superimposes the FTIR spectra of a baseline TMSA CDO film and a typical ODC film. Note that the similarity makes the TMSA baseline film unsuitable for many applications where CDO and ODC layers are interspaced, as is typically done in an interconnect stack. This is because the difference in structure between CDO and ODC layers is typically taken into account when selecting etch chemistries and other integration conditions. If, for example, the CDO and ODC layers have the same etch resistance, integration of the films into an interconnect stack becomes more complicated since current etchants cannot distinguish between the two layers, causing over- or under-etching problems and potentially creating a need for new integration schemes.

In order to use existing integration schemes, the TMSA baseline film has been optimized such that it has an etch resistance/refractive index more like a conventional CDO film, without sacrificing the advantages gained by using TMSA (i.e., low-stress, low-k values, and improved mechanical properties).

Precursor/Carrier Gas Selection

Figure 2:
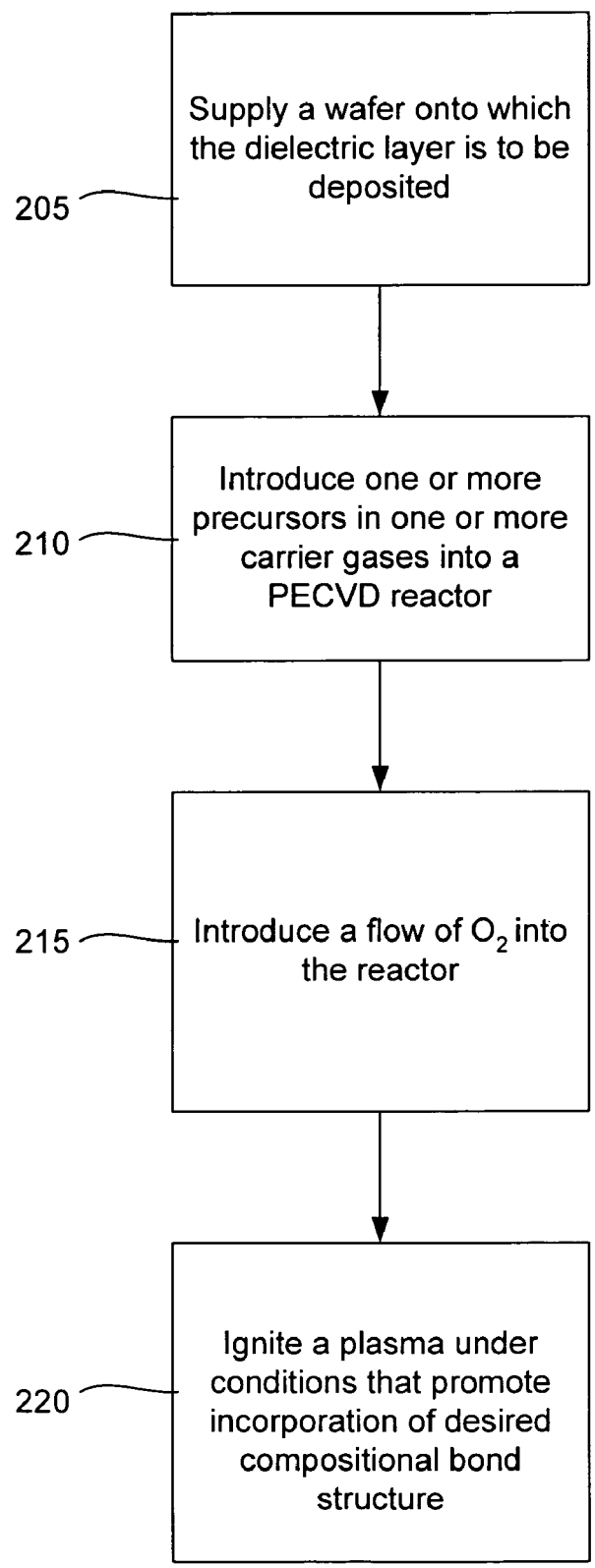
FIG. 2 is a flowchart illustrating a high level one methodology for creating CDO dielectric layers with low residual stress, low-k, high hardness/modulus, and improved integration properties.

FIG. 2 is a flowchart illustrating a high level one methodology for creating CDO dielectric layers with low residual stress, low-k, high hardness/modulus, and improved integration properties. In step 205 a wafer is supplied. In step 210 one or more precursors are supplied in one or more carrier gases. Precursors are chosen to have a high carbon content and, in some embodiments, one or more double bonds or unsaturated bonds in the form of carbon-carbon triple bonds. In one embodiment of the invention, the primary precursor is TMSA. Additional precursors, such as diethoxymethylsilane (DEMS), hexafluoroethane ($C_2F_6$) and tetramethylcyclotetrasiloxane (TMCTS), are added in some embodiments. Carrier gases include $CO_2$, helium, and argon. In optional step 215, oxygen is added to the flow of carrier gases and precursors. In step 220, a plasma is ignited under conditions that promote incorporation of desired compositional bond structure in the CDO film. In one embodiment of the invention, a plasma enhanced chemical vapor deposition (PECVD) reactor is used to contain the plasma. The selection of precursors, oxygen flow rates, and carrier gases, as well as a description of a suitable reactor chamber, is described below.

Figure 3:
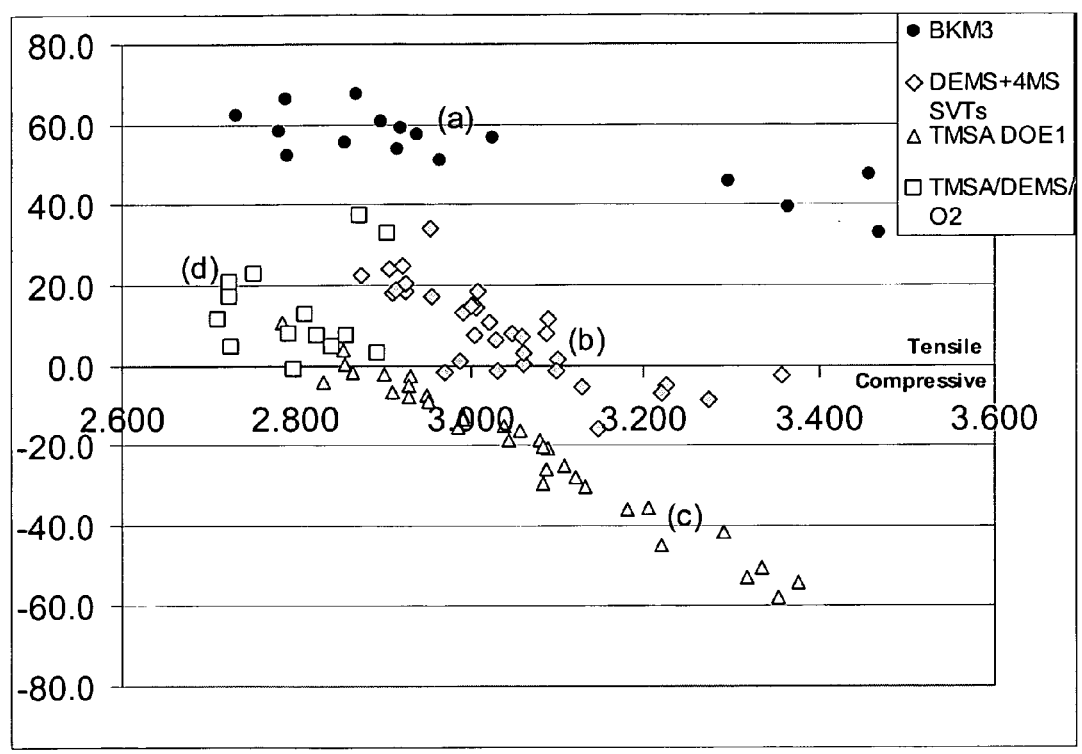
FIG. 3 plots k-value versus stress for CDO films produced according to several embodiments of the present invention as well as for two reference films.

FIG. 3 plots k-value versus stress for CDO films produced according to several embodiments of the present invention (labeled (c) and (d)). For comparison, data points for film (a) illustrate k-value/stress points for a conventional CDO film with a k-value of approximately 2-8 to 3 and stresses of between 50-70 MPa. The (a) film was deposited using DEMS as the CDO precursor and $CO_2$ as the carrier gas.

Initial experiments directed at lowering the tensile stress of the film incorporated more carbon into the film by adding tetramethyl silane (4MS), represented in FIG. 3 as film (b). However, films with desirable stress levels formed by the addition of 4MS tended to have k-values >3.1. To demonstrate the extendibility of the k-value of the film to a target of 2.7, a different precursor, TMSA, was employed, resulting in film (c), which had lower k-values for compressive films, but showed a large amount of carbon and a comparatively low $SiO_x$ (see FIGS. 1 and 2, above).

FIG. 3, film (d) shows CDO films prepared by adding either DEMS or $O_2$ to the mix, which alters the structure of the deposited film such that the FTIR spectrum changes from a carbide-like spectrum to a much more CDO-like spectrum. Note that the data for plot (d) shows that, for the same stress value, the deposited films have lower-k. Clearly, the combination of low-stress, low k, and more CDO-like behavior demonstrates the advantages of DEMS and or $O_2$ addition. Moreover, the data demonstrates the extendibility of the process to k-values as low as 2.7.

Figure 4:
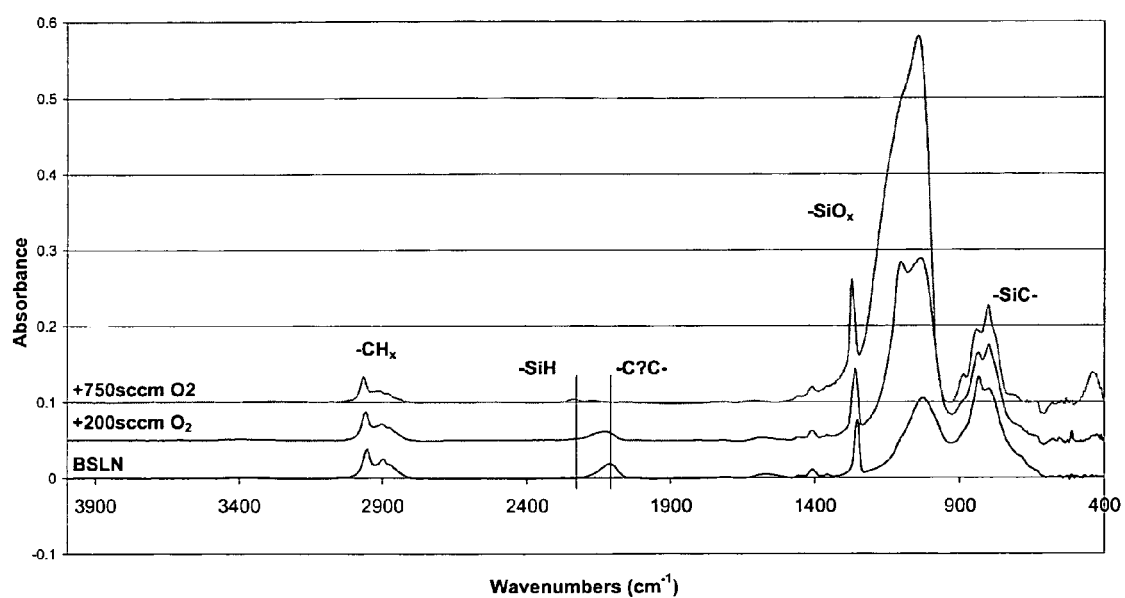
FIG. 4 compares the FTIR spectra of a baseline TMSA film to films with 200 sccm and 750 sccm of $O_2$ added to the mix.
Figure 5:
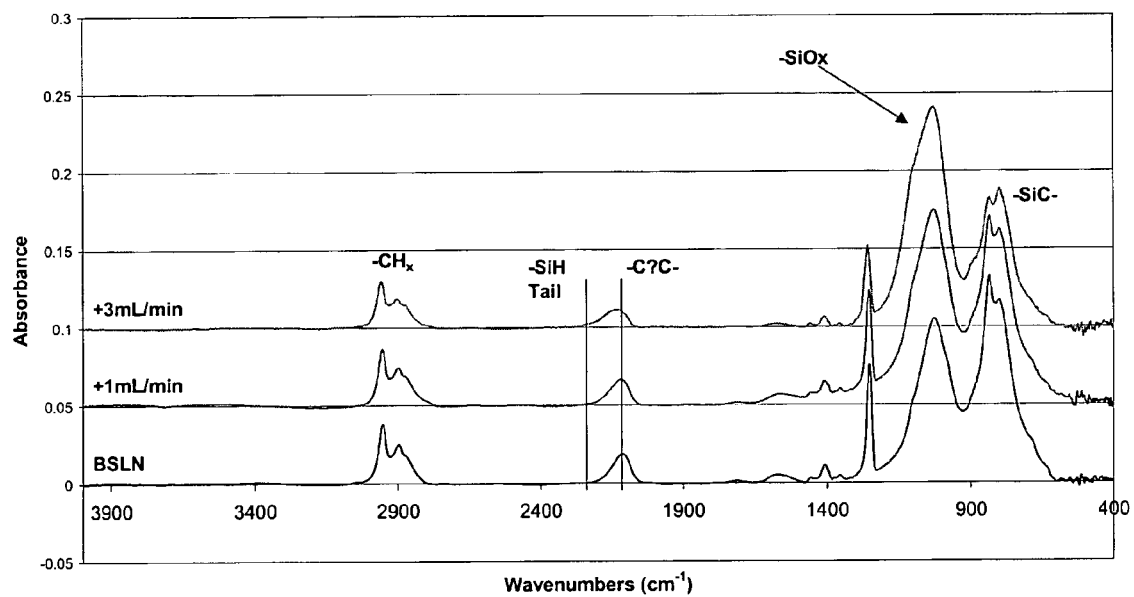
FIG. 5 compares the FTIR spectra of a baseline TMSA film to films with 1 and 5 mL/min of DEMS added.
Figure 6:
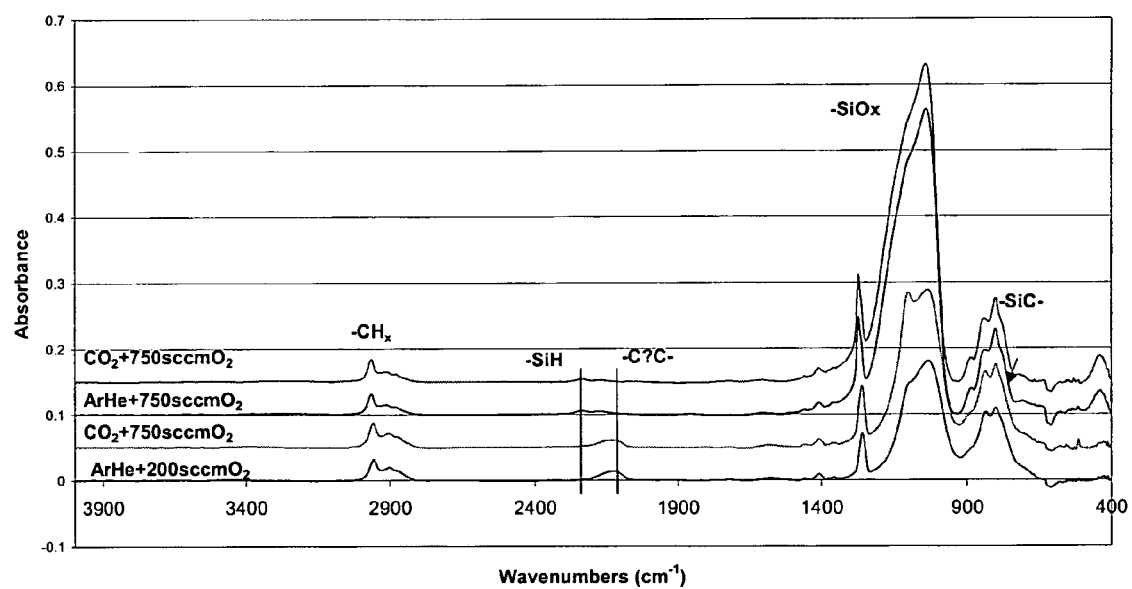
FIG. 6 compares the FTIR spectra of the films in FIG. 4 with films using argon and helium as carrier gases rather than $CO_2$.

Table 1, shown below, summarizes the impact of each of the above additions, as well as the case where argon and helium are used as carrier gases in place of $CO_2$ (described below). Data for HMS CORAL™ (a conventional CDO film currently in use in many applications) is included for comparison. FIGS. 4, 5 and 6 are FTIR spectra which correspond to the data in Table 1. FIG. 4 compares the FTIR spectra of the baseline TMSA film to films with 200 sccm and 750 sccm of $O_2$ added to the mix. FIG. 5 compares the FTIR spectra of the baseline TMSA film to films with 1 and 5 mL/min of DEMS added. FIG. 6 compares the FTIR spectra of the films in FIG. 4 with films using argon and helium as carrier gases rather than $CO_2$.

TABLE 1

| Condition | Dielectric Constant | Stress (MPa) | Hardness/Modulus (GPa) | Refractive Index | SiC:SiO$_x$ Bond Ratio | SiH/SiO$_x$ Bond Ratio |
|---|---|---|---|---|---|---|
| HMS CORAL | 3.05 | 55 | 2.1/12.9 | 1.4568 | 0.25 | 0.05 |
| TMSA Baseline | 2.85 | 3.8 | 0.92/6.92 | 1.5764 | 1.05 | 0.17 |
| +200 sccm O$_2$ | 2.81 | 12.9 | 1.00/6.94 | 1.5216 | 0.29 | 0.03 |
| +750 sccm O$_2$ | 2.87 | 37.2 | 1.44/8.59 | 1.4449 | 0.16 | N/A |
| +1 mL/min DEMS | 2.82 | 6.8 | 1.01/7.21 | 1.5644 | 0.68 | 0.12 |
| +3 mL/min DEMS | 2.84 | 11.0 | 1.19/7.99 | 1.5294 | 0.38 | 0.07 |
| Baseline – CO$_2$ + Ar + He | 2.89 | 2.9 | 1.33/8.75 | 1.5516 | 0.36 | 0.06 |
| +200 sccm O$_2$ | | | | | | |
| +750 sccm O$_2$ | 2.91 | 33.0 | 1.61/9.61 | 1.4511 | 0.16 | N/A |

As can be seen in Table 1, adding 200 sccm of O$_2$ to the baseline process improves RI, k and hardness, for a slightly more tensile film. Continuing to add oxygen (750 sccm) continues to reduce the RI and increase the hardness, but also starts to increase k and increases stress. The FTIR spectra in FIG. 4 show structure changes that correspond to increasing the O$_2$ content by adding 200 sccm and 750 sccm and includes the FTIR spectrum for the baseline film for comparison. The peak at ~1030 cm$^{-1}$ corresponds to the SiO$_x$ backbone, and the peak at ~800 cm$^{-1}$ corresponds to SiC bonds in the film. Increasing O$_2$ content clearly modulates the ratio of these two peaks. Adding smaller amounts of O$_2$ creates a film with more SiO$_x$ while maintaining the formation of a low-stress film.

To judge the change in the SiO$_x$ backbone, the SiC to SiO$_x$ FTIR peak areas were calculated and are reported in Table 1 as bond ratios. The TMSA baseline film has a peak ratio of 1.05, indicating that there is less SiO$_x$ than SiC in the film, a smaller ratio than even the ODC film (not shown). Adding 200 sccm O$_2$ to this process moves the SiC:SiO$_x$ ratio to 0.29, which is in line with the conventional produced CORAL film (SiC:SiO$_x$=0.25). Further increasing the oxygen content (O$_2$=750 sccm) moves the ratio even lower (SiC:SiO$_x$=0.16) than the conventional film. In addition to peak area changes, the shape of the SiO$_x$ peak also changes. As more oxygen is added, the peak broadens, which shows that the SiO$_x$ network is moving to a structure with a higher portion of broad angle O—Si—O bonds and the beginning of SiO cage structures within the film. (see Grill, A. et al., Journal of Applied Physics, Vol. 49, Iss. 10, p. 6697). This is a significant change, since the broader bond angles are characteristic of an oxide film rather than a carbide barrier film. Thus, the data shows that the addition of small amounts of oxygen changes the fundamental structure of the film to a more oxide-like structure without significantly increasing the residual stress of the film.

The other notable peak feature in the FTIR spectrum is the combination of the SiH and —C≡C— peaks in the region 2300-2000 cm$^{-1}$. In the baseline spectra presented in FIG. 1A, the peak shows only the presence of SiH (peak position>2120 cm$^{-1}$). The TMSA baseline film spectrum shows only the presence of the —C≡C— (peak position ~2110 cm$^{-1}$). In Table 1, the combined peak area for this region is reported as the SiH:SiO$_x$ bond. As the amount of O$_2$ in the process is increased, this peak ratio decreases dramatically. The —C≡C— is oxidized by the O$_2$ and at the higher O$_2$ flow, no longer appears in quantities great enough to be seen in the FTIR.

In one embodiment of the invention, DEMS (SiC$_3$O$_2$H$_{10}$) is substituted for O$_2$. Looking at Table 1, DEMS causes a slight decrease in RI and k, and slight increase in stress and hardness. The FTIR for DEMS films formed by adding 1 mL/min and 3 mL/min is shown in FIG. 5. The FTIR spectra show that similar changes are obtained when adding DEMS as when adding O$_2$ to the process, which is consistent with the results shown in FIG. 3, film (d) above. As in FIG. 4, an FTIR spectrum for a baseline CDO film is shown for comparison. The SiC:SiO$_x$ ratio for the DEMS is 0.68 for DEMS flow of 1 mL/min and 0.38 for DEMS flow of 3 mL/min. However, it is noted that the increase in the SiO$_x$ backbone structure is not as great with DEMS as with the O$_2$. This result is expected, since DEMS brings carbon as well as oxygen to the reaction, and, unlike O$_2$, it is believed that DEMS is incorporated as part of the film rather than reacting and changing other components of the film. Also, an increase of SiH is seen for the +3 mL/min spectrum, where an SiH "tail" is visible at ~2230-2250 cm$^{-1}$ in FIG. 5.

In another embodiment, the carrier gas is changed from CO$_2$ to an Ar/He mixture (in Table 1, results for this embodiment are labeled 'Baseline–CO$_2$+Ar+He'). Many standard CDO deposition processes use only CO$_2$ as the carrier gas and as the main oxidative component necessary to break down the precursor and deposit the film. It is believed that these gases increase the ion bombardment of the film, leading to harder and lower stress films than with CO$_2$ alone. Substituting inert gases for CO$_2$ significantly increases k and also significantly increased the film's hardness from 1.00 GPa to 1.33 GPa for the conditions where 200 sccm O$_2$ is added to the processes. However, when O$_2$ is added to an Ar/He plasma, it is not quite as active in removing carbon from the film. This change is reflected in Table 1 by a smaller RI change when compared to the results obtained when using CO$_2$. This difference is also noted in the FTIR spectra presented in FIG. 6, which compares films deposited using CO$_2$ and O$_2$ to films deposited by substituting Ar and He for CO$_2$. Note, however, that in FIG. 6, the difference in carrier gasses is substantially undetectable when 750 sccm of O$_2$ is added to the mix, leading to the conclusion that the O$_2$ is the active species in this regime.

Some specific examples of process gas combinations used according to various embodiments of the invention include:

TMSA+CO$_2$
TMSA+CO$_2$+O$_2$
TMSA+CO$_2$+Ar
TMSA+Ar+He+O$_2$
TMSA+CO$_2$+DEMS
TMSA+CO$_2$+TMCTS+Ar
TMSA+CO$_2$+C$_2$H$_6$+Ar
TMSA+CO$_2$+Ar+O$_2$

While the primary focus of this invention is improving the integration properties of low-stress CDO films, the films preferably possess a variety of other mechanical properties rendering them suitable for integration in demanding IC fabrication processes. Examples of such other mechanical properties include hardness, modulus, blanket film cracking limit, fracture toughness (resistance to crack propagation after a crack is initiated) and cracking propagation velocity.

Process Optimization

Various deposition techniques may be employed to form the CDO dielectric materials of this invention. These include various other forms of chemical vapor deposition (CVD) including plasma enhanced CVD (PECVD) and high-density plasma CVD (HDP CVD). HDP CVD of dielectric materials is described in various sources including U.S. patent application Ser. No. 09/996,619, filed Nov. 28, 2001 by Atiye Bayman et al. and titled "Gap Fill for High Aspect Ratio Structures", which is incorporated herein by reference for all purposes. Additionally, other techniques such as spin on techniques and deposition from supercritical solutions may be employed. But for many applications of this invention, a plasma based CVD process is employed.

The process deposition conditions may be optimized to reduce either the intrinsic or extrinsic stress (or both) of a CDO film. Conditions that reduce intrinsic stress generally enhance/promote the incorporation of desired bonding structures in the as deposited CDO films.

Further, the deposition conditions need to be optimized to promote the crosslinking of incorporated bonds. Without this crosslinking, the film mechanical strength will generally be low due to the fact that an increase in content of methyl group $CH_3$ as a terminating group in the CDO film will reduce the bonding density per volume thus the bonding integrity of the film. With crosslinking, the Si—O—Si matrix structure is strengthened. As a result, the mechanical strength, or the fracture toughness, of the as deposited CDO film will be high.

Compositional bonds formed in CDO film of particular interest to this invention include Si—$CH_2$—Si, Si—C≡C—Si, Si—CH=CH—Si, Si—$CH_2$—$CH_2$—Si and other derivatives of these bonds due to Si, C or O crosslinking, such as Si—O—C≡C—Si, Si—O—CH=CH—Si, Si—C(—H, —OSi)—$CH_2$—Si, etc. It is noted that the chemical bond length and angle varies with the degree of saturation and crosslinking. Nominal bond length of the C—C bond is ~1.5 Å, that of the C=C bond is ~1.3 Å, that of the C≡C bond is ~1.2 Å, and that of the C—O bond is ~1.1 Å while the nominal bond length of the Si—O bond is ~1.6 Å and that of the Si—C bond is ~1.9 Å. It is evident that the incorporation of C≡C bond and its derivatives (C=C, C—C) and their crosslinking within the CDO film will greatly influence the Si—O—Si matrix structure. More specifically, the Si—O—Si bond angle will change significantly as the desired C related bonds are incorporated and crosslinked. Since the Si—O—Si matrix is the backbone structure of the CDO film, the change in Si—O—Si bond angle will alter the structural mismatch between the as-deposited CDO film and the substrate, hence the intrinsic stress of the CDO film. Experimental data shown below will discuss the variation of the Si—O—Si bond angle as CDO film stress lowers in more detail.

As discussed above, intrinsic stress can be reduced by incorporating C≡C bonds and its derivatives and promoting cross-linking/bridging in the CDO film. Due to the very reactive nature of carbon-carbon triple bond, there is abundant incorporation of C≡C bond in the as deposited CDO film. To further enhance its incorporation and its crosslinking within the CDO film, one method is to increase ion bombardment during the PECVD deposition. Process conditions that increase ion bombardment may be chosen to increase one or both of (a) the mean energy of ion striking the substrate and (b) the flux of ions reaching the substrate. Physically, these results may be achieved by selecting process conditions that accomplish one of the following: (i) increasing the mean free path of the ions in the plasma, (ii) reducing the distance that an ion must travel before striking the substrate, and (iii) increasing the mean energy or momentum of the ions that strike the substrate surface.

To increase the momentum or energy of ions striking the substrate surface, at least two different process conditions may be manipulated. First, using a dual-frequency reactor of the type described below, one can increase the relative amount of the low frequency component of the RF energy supplied to the reactor. This has the effect of increasing the length of time in a given oscillation during which ions are accelerated in a single direction (toward the wafer surface). Because the ions are exposed to a field in this direction for a longer period of time, they can accelerate to higher speeds and hence strike the substrate with greater momentum. Second, one can pulse the high frequency component of the RF power to accomplish a similar result.

As is well known in the art, in general, high frequency components of the RF power delivered to a reactor control the plasma density and low frequency components produce ion bombardment of the film. The high and low frequency components can be provided at any of a number of suitable frequencies. In a typical process, the LF component is provided in a frequency range of about 100 to 600 kHz, more preferably about 200-500 kHz, for example about 300 kHz. The High Frequency HF component is generally between 2-60 MHz—in one process example, an HF frequency of 13.156 MHz is used.

In one embodiment, the low frequency component of delivered RF power is between about 0 and 100 percent of the total power, and more preferably between about 20 and 60 percent of the total power (e.g., between about 30 and 40 percent). The optimal value will vary depending upon the mean free path of the ions and the various conditions that impact mean free path. In a specific example, the total power delivered is about 800 Watts on six 200 mm wafers at 0.42 W/cm$^2$ in area density or 1270 Watts on four 300 mm wafers at 0.67 W/cm$^2$. This value can be varied depending upon the specific application and plasma reactor employed. In many cases, the low frequency component has a power area density of between about 0 W/cm$^2$ and 20 W/cm$^2$, and more preferably between 0 W/cm$^2$ and 1 W/cm$^2$.

In addition to varying the ratio of HFRF to LFRF, the HFRF power may be pulsed at a certain duty cycle, for example, pulsing at between 500 Hz and 10 kHz and varying the HFRF duty cycle from 20-80%. This effectively superimposes a low frequency component on the plasma generation power.

Another method that may be used to increase ion bombardment during film deposition is to alter the deposition pressure. This simply increases the mean free path of ions in the deposition chamber. In one embodiment of the invention the deposition pressure is maintained at a pressure of between about 0.5 to 20 Torr, more preferably in the range of about 2.0 to 7 Torr.

Still another adjustment that may be used involves varying showerhead gap, defined as the distance between the showerhead and the thermal block on which the substrate is located. This varies the distance that an ion must travel before striking the substrate. The ideal gap depends on the type of reactor employed and the process conditions. For many situations, the gap is preferably between about 0.5 and 10 cm.

Process optimization also includes setting the proper flow rates of the various compounds in the process gases. Note that the flow rates are chosen depending upon the amount of surface area to be covered. One can certainly scale the flow rates chosen depending upon variations in the area to be deposited, including in situations where the reactor employs fewer or greater number of wafers and possibly employs 300 millimeter wafers as opposed to 200 millimeter wafers. For example, in experiments where six 200 millimeter wafers or four 300 mm were used, the total precursor flow rate was 0.1 mL/min to about 10 mL/min as in liquid forms. In experiments where TMSA was used, flow rates ranged broadly between about 1 mL/min to 10 mL/min, preferably between about 1 mL/min to five mL/min. When DEMS was added, flow rates ranged broadly between about 0.3 mL/min to 5 mL/min, preferably between about 1 mL/min to 3 mL/min. When TMCTS was added to the process, flow rates ranged broadly between about 0.3 mL/min to 5 mL/min, preferably between about 1 mL/min to 3 mL/min. Finally, in experiments where Hexafluoroethane ($C_2H_6$) was added, flow rates ranged broadly between about 0 mL/min to 1000 mL/min, preferably between about 0 mL/min to 500 mL/min.

Additionally, process optimization involves setting the proper flow rates for the various carrier and oxidizing gases, including $CO_2$, Ar, He, and $O_2$. For example, in experiments where six 200 millimeter or four 300 mm wafers were used, the total flow rate for all carrier and oxidizing gases was about 60 sccm to about 6000 sccm.

When $CO_2$ was used as a carrier gas, flow rates ranged broadly between about 1000 sccm to 15000 sccm, preferably between about 1500 sccm to 8000 sccm. When Ar was used, flow rates ranged broadly between about 1000 sccm to 10000 sccm, preferably between about 1500 sccm to 3500 sccm. In experiments where He was added, flow rates ranged broadly between about 1000 sccm to 10000 sccm, preferably between about 1500 sccm to 2500 sccm. Finally, when $O_2$ was added, flow rates ranged broadly between about 100 sccm to 1000 sccm, more preferably between about 100 sccm to 400 sccm.

The mechanical properties of CDO films with low- or tensile stress improve significantly as indicated by the integration examples presented below. It is also noted that the blanket film-cracking limit has improved significantly for all k values below 3.0. The cracking limit of CDO film of k=2.60 was improved from 1.5 μm to 3 μm. The cracking limit of CDO film of k=2.70 was improved from ~2.2 μm to 5 μm. The cracking limit of CDO film of k=2.90 was improved from 2.5 μm to >10 μm. Combined with a substantially unaltered modulus, the low-stress CDO films demonstrated a remarkable improvement in film cracking resistance, thus providing a more robust dielectric film for Cu/low k integration and packaging. In general, films with net compressive stress prepared according to embodiments of this invention have a cracking limit of greater than about 10 μm, while those films with net tensile residual stress have a cracking limit of between 0 and 10 μm, preferably in the range of greater than about 5 μm. Furthermore, as noted above, the increase in film cracking limit did not come at the expense of losses in modulus. The improved low-stress CDO films described herein have modulus values that range broadly between about 6 GPa and 25 GPa, preferably not less than about 13 Gpa.

INTEGRATION EXAMPLES

Example 1

To produce the baseline film, 5 mL/min of TMSA was carried by 1500 sccm of $CO_2$ and 1000 sccm of Ar at 5 Torr and 350° C. The plasma was ignited by 1200 W high frequency and 800 W low frequency RF power. These conditions produced R30, a film with k=2.85, stress=3.8 MPa tensile, hardness/modulus=0.92/6.92 GPa, and RI of 1.5764. Adding 200 sccm of $O_2$ to this exact process created a film with k=2.81, stress=12.9 MPa tensile, hardness/modulus=1.00/6.94 GPa and RI=1.5216.

Example 2

A film with k=2.79, stress=−0.82 MPa (compressive) and RI=1.5384, is produced by adding 1 mL/minDEMS to the baseline film production process (example 1), and reducing power to 720 W high frequency RF and 480 W low frequency RF.

Example 3

A film with a k of 3.07, stress=3 MPa tensile and RI=1.54 with a hardness of 2 GPa and modulus of 13.7 GPa is produced using TMSA at a flow rate of 3.5 mL/min, and adding $CO_2$ at a flow rate of 3000 sccm, Ar at a flow rate of 1500 sccm, and $O_2$ at a flow rate of 100 sccm. Pressure is maintained at about 4 Torr and the plasma is produced using a high frequency power of 579 W and a low frequency power of 248 W with a substrate temperature of 400 C.

Example 4

A film with a k of 3.07, stress=1.5 MPa and RI=1.61 with a hardness of 1.9 GPa and a modulus of 14 GPa is produced using TMSA at a flow of 3.5 mL/min, and adding $CO_2$ at a flow rate of 3000 sccm, Ar at a flow rate of 1500 sccm, and Hexafluoroethane ($C_2F_6$) at a flow rate of 250 sccm. Pressure is maintained at about 4 Torr and the plasma is produced using a high frequency power of 579 W and a low frequency power of 248 W with a substrate temperature of 400 C.

Example 5

A film with a k of 3.07, stress=25 MPa and RI=1.53 with a hardness of 2.4 GPa and a modulus of 16 GPa is produced using TMSA at a flow of 2 mL/min, and adding $CO_2$ at a flow rate of 3000 sccm, Ar at a flow rate of 1000 sccm, and TMCTS at a flow rate of 1.5 mL/min. Pressure is maintained at about 4.5 Torr and the plasma is produced using a high frequency power of 455 W and a low frequency power of 372 W with a substrate temperature of 400 C.

Example 6

A film with a k of 3.01, stress=−2 MPa (compressive) and RI=1.53 with a hardness of 2.1 GPa and a modulus of 13.5 GPa is produced using TMSA at a flow of 3 mL/min, and adding Ar at a flow rate of 2000 sccm, He at a flow rate of 2000 sccm, and $O_2$ at a flow rate of 200 sccm. Pressure is maintained at about 5 Torr and the plasma is produced using a high frequency power of 720 W and a low frequency power of 480 W with a substrate temperature of 400 C.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. While in the process, each wafer is held in place by a pedestal, wafer chuck and/or other wafer holding apparatus. For certain operations in which the wafer is to be heated, the apparatus may include a heater such as a heating plate. In a preferred embodiment of the invention, a PE-CVD (Plasma Enhanced Chemical Vapor Deposition) system may be used as well as, for example, an HDP CVD (High Density Plasma Chemical Vapor Deposition) system.

Figure 7:
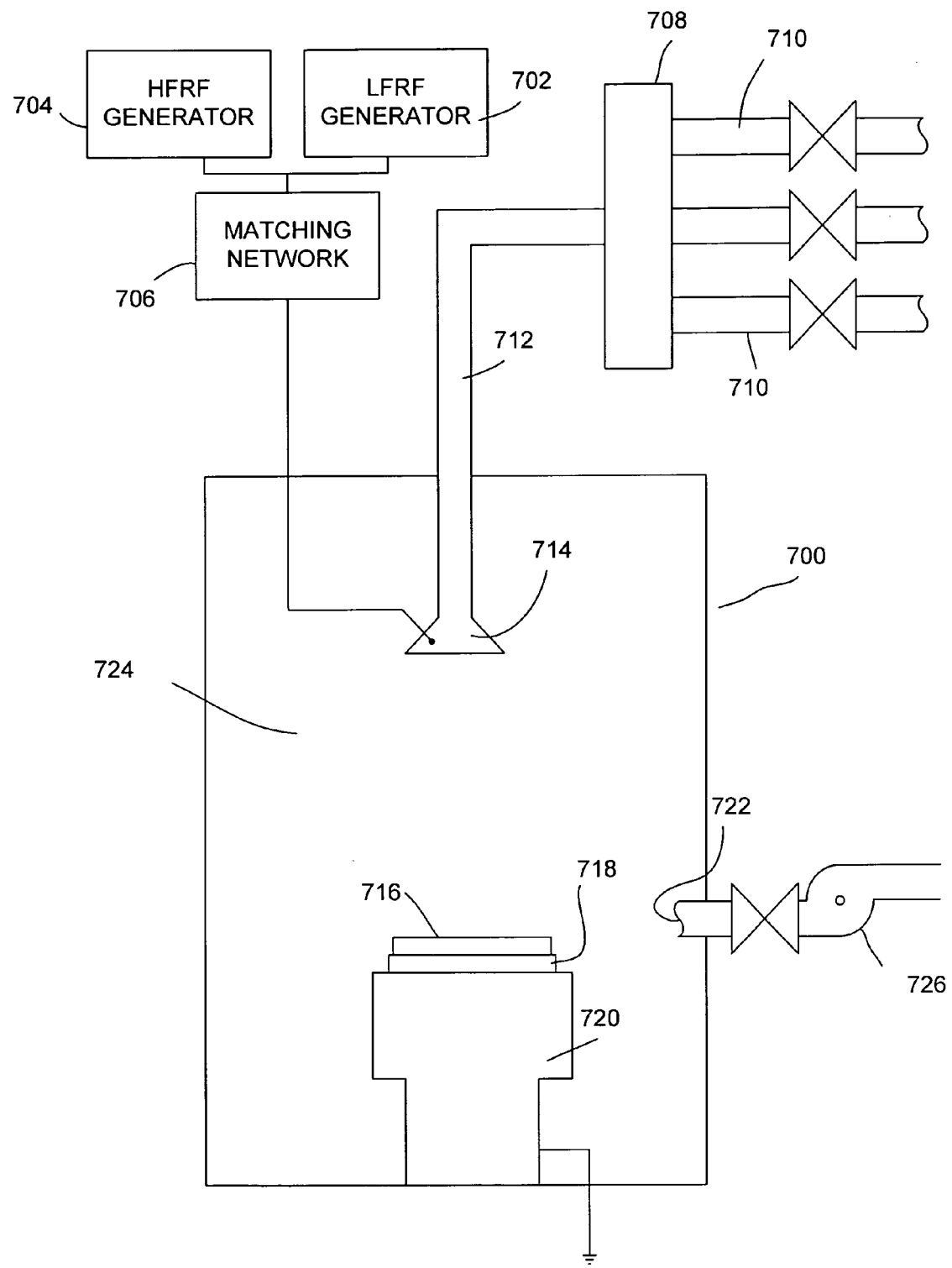
FIG. 7 plots residual film stress as a function of k value for films deposited using different precursors.

FIG. 7 provides a simple block diagram depicting various reactor components arranged for implementing the present invention. As shown, a reactor 700 includes a process chamber 724, which encloses other components of the reactor and serves to contain the plasma generated by a capacitor type system including a showerhead 714 working in conjunction with a grounded heater block 720. A low-frequency RF generator 702 and a high-frequency RF generator 704 are connected to a matching network 706 that, in turn, is connected to showerhead 714. The power and frequency supplied by matching network 706 is sufficient to generate a plasma from the process gas, for example, 800 W total energy.

Within the reactor, a wafer pedestal 718 supports a substrate 716. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 712. Multiple source gas lines 710 are connected to manifold 708. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 700 via an outlet 722. A vacuum pump 726 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Applications

This invention broadly applies to deposition of low-k low residual stress CDO dielectric materials on any type substrate. In many cases, however, the CDO dielectric materials will be used in integrated circuits or other electronic devices. A preferred use for the CDO films of this invention is for interlayer dielectric (ILD) applications (including both inter-level dielectrics (between active devices and the first metallization layer and intermetal dielectrics ("IMD" between adjacent metallization layers)). In these applications, the CDO films serve to replace conventional silicon dioxide or fluorinated silica glass (FSG) materials. Examples of non-ILD applications include barrier and etch-stop (ES) layers, antireflective layers (ARL), hardmask layers, etc.

The ultimate thickness of a CDO dielectric film produced in accordance with this invention depends upon the application. For example, the final thickness for an interlayer dielectric or packaging application may range from 400 Angstroms to about 2 to 3 micrometers ($\mu$m). In some cases, extra thickness is required to provide some amount of sacrificial dielectric to accommodate a subsequent planarization step.

In a preferred embodiment, the CDO films produced in accordance with this invention are used in multiple metallization layers. Such devices may have, for example, five or more metallization layers and five or more associated CDO films.

Other Embodiments

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of preparing a carbon doped silicon oxide (CDO) film on a substrate, the method comprising:
   (a) providing the substrate to a deposition chamber; and
   (b) contacting the substrate with a primary CDO precursor containing silicon and having a carbon-carbon triple bond and a secondary CDO precursor selected from DEMS, TMCTS and hexafluoroethane, under process conditions whereby the CDO film is formed on the substrate, such that the CDO film contains carbon-carbon triple bonds and their derivative bonds and whereby the CDO film has a dielectric constant of less than about 3.2, a net tensile stress of less than about 40 MPa, a hardness of at least about 1 GPa, and a SiC:SiO$_x$ bond ratio of not greater than about 0.75.

2. The method of claim 1, wherein the CDO film has a dielectric constant of less than about 2.85, a tensile stress of less than about 13, and a SiC:SiO$_x$ bond ratio of not greater than about 0.3.

3. The method of claim 1, wherein the CDO film has a compressive stress or a tensile stress of less than about 10 MPa.

4. The method of claim 1, wherein the CDO film has a compressive stress or a tensile stress of less than about 5 MPa.

5. The method of claim 1, wherein the CDO film has a SiC:SiO$_x$ bond ratio of not greater than about 0.45.

6. The method of claim 1, wherein the substrate is a partially fabricated integrated circuit.

7. The method of claim 1, wherein the CDO film is an interlayer dielectric in an integrated circuit.

8. The method of claim 1, wherein the deposition chamber comprises one or multiple stations that allow processing one or multiple substrates in parallel.

9. The method of claim 1, wherein the CDO film is formed on the substrate by a chemical vapor deposition process.

10. The method of claim 1, wherein the CDO film is formed on the substrate by a spin coating process.

11. The method of claim 1, wherein the CDO film is formed on the substrate by a plasma enhanced chemical vapor deposition (PECVD) process.

12. The method of claim 1, wherein contacting the substrate involves contacting with only a single CDO precursor in one or more carrier gases.

13. The method of claim 1, wherein the CDO precursor is trimethylsilaneacetylene (TMSA).

14. The method of claim 13, further comprising introducing the TMSA into the deposition chamber using one or more carrier gases.

15. The method of claim 14, wherein the one or more carrier gases comprise $CO_2$.

16. The method of claim 15, wherein the one or more carrier gases further comprise Ar.

17. The method of claim 14, wherein the one or more carrier gases comprise Ar and He.

18. The method of claim 15, further comprising introducing $O_2$ into the chamber.

19. The method of claim 16, further comprising introducing $O_2$ into the chamber.

20. The method of claim 17, further comprising introducing $O_2$ into the chamber.

21. The method of claim 1, wherein contacting the substrate involves contacting the substrate with only a primary CDO precursor and a secondary CDO precursor in one or more carrier gases.

22. The method of claim 1, wherein the CDO precursor is provided in a carrier gas.

23. The method of claim 12, wherein the one or more carrier gases comprise one or more gases selected from the group consisting of carbon dioxide, oxygen, helium, and argon.

24. The method of claim 14, wherein the flow rate of TMSA is between about 0.3 mL/min to 10 mL/min.

25. The method of claim 14, wherein the flow rate of TMSA is between about 2.5 mL/min to 3.5 mL/min.

26. The method of claim 1, wherein the secondary precursor is DEMS and the flow rate of DEMS is between about 0.3 mL/min to 5 mL/min.

27. The method of claim 1, wherein the secondary precursor is DEMS and the flow rate of DEMS is between about 1.5 mL/min to 2.5 mL/min.

28. The method of claim 1, wherein the secondary precursor is TMCTS and the flow rate of TMCTS is between about 1 mL/min to 3 mL/min.

29. The method of claim 1, wherein the secondary precursor is TMCTS and the flow rate of TMCTS is between about 1 mL/min to 2 mL/min.

30. The method of claim 18, wherein the flow rate of $O_2$ is between about 100 sccm to 1000 sccm.

31. The method of claim 19, wherein the flow rate of $O_2$ is between about 100 sccm to 400 sccm.

32. The method of claim 1, wherein the secondary precursor is hexafluoroethane and the flow rate of hexafluoroethane is between 0 mL/min to 1000 mL/min.

33. The method of claim 1, wherein the secondary precursor is hexafluoroethane and the flow rate of hexafluoroethane is between 0 mL/min to 500 mL/min.

34. The method of claim 16, wherein the flow rate of $CO_2$ is between about 1000 sccm to 15000 sccm.

35. The method of claim 16, wherein the secondary precursor is DEMS and the flow rate of $CO_2$ is between about 1500 sccm to 8000 sccm.

36. The method of claim 20, wherein the flow rate of He is between about 1000 sccm to 10000 sccm.

37. The method of claim 20, wherein the flow rate of He is between about 1500 sccm to 2500 sccm.

38. The method of claim 16, wherein the secondary precursor is TMCTS and the flow rate of Ar is between about 1000 sccm to 10000 sccm.

39. The method of claim 16, wherein the secondary precursor is hexafluoroethane and the flow rate of Ar is between about 1500 sccm to 3500 sccm.

40. The method of claim 1, wherein the deposited CDO film has a $SiC:SiO_x$ bond ratio of between about 0.2 to 0.7.

41. The method of claim 1, wherein the deposited CDO film has a $SiH:SiO_x$ bond ratio of between about 0.01 to 0.18.

42. The method of claim 1, wherein the CDO film has a net tensile residual stress and a cracking limit of between about 0 and 10 μm.

43. The method of claim 1, wherein the CDO film has a cracking limit of greater than about 5 μm.

44. The method of claim 1, wherein the CDO film has a modulus of between about 6 GPa and 25 GPa.

45. The method of claim 1, wherein the CDO film has a modulus of not less than about 13 GPa.

* * * * *